(12) United States Patent
Park et al.

(10) Patent No.: US 7,889,557 B2
(45) Date of Patent: Feb. 15, 2011

(54) NAND FLASH MEMORY DEVICE WITH INCREASED SPACING BETWEEN SELECTION TRANSISTORS AND ADJACENT MEMORY CELLS

(75) Inventors: Hee Sik Park, Chungcheongbuk-do (KR); Keon Soo Shim, Kyeongki-do (KR); Jong Soon Leem, Kyeongki-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/315,395

(22) Filed: Dec. 21, 2005

(65) Prior Publication Data

US 2006/0138563 A1 Jun. 29, 2006

(30) Foreign Application Priority Data

Dec. 28, 2004 (KR) .................. 10-2004-0114223
Jun. 30, 2005 (KR) .................. 10-2005-0058020
Jul. 14, 2005 (KR) .................. 10-2005-0063716

(51) Int. Cl.
*G11C 16/04* (2006.01)
*H01L 21/70* (2006.01)

(52) U.S. Cl. ............ 365/185.17; 257/390; 257/E27.102

(58) Field of Classification Search ................ 257/390; 365/185.17
See application file for complete search history.

(56) References Cited

U.S. PATENT DOCUMENTS 5,332,917 A * 7/1994 Lee et al. .................... 257/390
5,515,320 A * 5/1996 Miwa ........................ 365/185.1
5,999,444 A * 12/1999 Fujiwara et al. ........ 365/185.02
6,157,056 A * 12/2000 Takeuchi et al. ............. 257/315
6,211,020 B1 * 4/2001 Tripsas et al. ............... 438/294
6,611,447 B2 8/2003 Nakamura et al.
6,673,678 B2 1/2004 Furuhata
6,812,091 B1 * 11/2004 Gruening et al. ............ 438/243
6,818,480 B2 * 11/2004 Lee et al. .................... 438/128
6,995,410 B2 * 2/2006 Hosono et al. .............. 257/211
2002/0033501 A1 * 3/2002 Sakagami .................... 257/315
2002/0155656 A1 * 10/2002 Hayano et al. .............. 438/238
2004/0079972 A1 * 4/2004 Yoon .......................... 257/215
2004/0152262 A1 * 8/2004 Ichige et al. ................ 438/257

FOREIGN PATENT DOCUMENTS

TW         563241      11/2003
TW        200425148    11/2004

* cited by examiner

*Primary Examiner*—Matthew C Landau
*Assistant Examiner*—Daniel Luke
(74) *Attorney, Agent, or Firm*—Kilpatrick Townsend & Stockton LLP

(57) ABSTRACT

A memory device capable of enlarging an interval between a source selection transistor and a memory cell adjacent to the source selection transistor, enlarging an interval between a drain selection transistor and a memory cell adjacent to the drain selection transistor, or enlarging the intervals between the source selection transistor and the memory cell adjacent to the source selection transistor and between the drain selection transistor and the memory cell adjacent to the drain selection transistor, prevents the memory cell adjacent to the source or drain selection transistor from being degraded in programming speed due to program disturbance.

4 Claims, 5 Drawing Sheets

NAND FLASH MEMORY DEVICE WITH INCREASED SPACING BETWEEN SELECTION TRANSISTORS AND ADJACENT MEMORY CELLS

CROSS REFERENCE TO RELATED APPLICATIONS

The present application claims priority to Korean Patent Application Nos. 2004-114223, filed Dec. 28, 2004; 2005-58020, filed Jun. 30, 2005; and 2005-63716, filed Jul. 14, 2005 which are incorporated by reference.

BACKGROUND OF THE INVENTION

The present invention relates to NAND flash memory devices and more particularly, to a NAND flash memory device having an enlarged interval between a selection transistor and the memory cell adjacent to the selection transistor.

A memory cell array of a NAND flash memory device is constructed in the unit of a string, including pluralities of cell strings therein. Each cell string includes selection transistors and pluralities of memory cells connected in series. The structure of the cell string is illustrated in FIG. 1.

FIG. 1 is a circuit diagram showing a conventional NAND flash memory device. A cell siring of the NAND flash memory device includes a drain selection transistor DST, a source selection transistor SST coupled to a common source line CSL, a plurality of word lines coupled to bitlines (BL0, BL1), and pluralities of memory cells MC0~MC31 coupled between the drain and source selection transistors, DST and SST, in series.

In a general NAND flash memory device, the drain selection transistor DST, the source selection transistor SST, and the memory cells MC0~MC31 have intervals (i.e., the distance between the transistors) that are about the same. Here, the memory cells may be arranged in 16, 32 or 64 memory cells in series in consideration with storage capacity and density of the device. The NAND flash memory device has pluralities of cell strings, each including 32 memory cells MC0~MC31.

In the structure of the flash memory device, program disturbance occurs at the memory cell MC0, which is coupled to a deselected bitline BL0 and a wordline WL0 adjacent to a source selection line SSL, and at the memory cell MC31 that is coupled to a deselected bitline BL0 and a wordline WL31 adjacent to a drain selection line DSL. This phenomenon arises from the fact that during a programming mode, a ground voltage 0V, the power source voltage Vcc, and a pass voltage Vpass are applied to the source selection line SSL, the drain selection line DSL, and the rest except the wordline of the selected memory cell to be programmed, respectively, the channels of the source selection transistor SST, the drain selection transistor DST, and the memory cells are respectively charged with about 0V, 1V, and 8V.

In further detail, a strong electric field is generated between the source selection transistor SST and the memory cell MC0 by a voltage difference between a source voltage 0V of the source selection transistor SST and a channel voltage 8V of the memory cell MC0 adjacent to the source selection transistor SST. A strong electric field is also generated between the drain selection transistor DST and the memory cell MC31 by a voltage difference between the power source voltage Vcc of the drain selection transistor DST and a channel voltage 8V of the memory cell MC31 adjacent to the drain selection transistor DST.

As such, when there are lateral electric fields between the selection transistors SST and DST and the memory cells adjacent thereto, electrons, which are generated from the interfaces among the semiconductor substrate and the selection transistors SST and DST, move toward the memory cells along the surface of the semiconductor substrate and are referred to as hot electrons. These hot electrons move vertically and flow into a floating gate of the memory cell MC0 or MC31 not to be programmed, causing the memory cell MC0 or MC31 to be programmed undesirably.

As a voltage at the side of the source selection transistor SST is higher than that of the drain selection transistor DST, the electric field appears stronger at the side of the source selection transistor SST. Therefore, the program disturbance is more serious in the memory cell MC0 adjacent to the source selection transistor SST than the memory cell MC31 adjacent to the drain selection transistor DST.

FIG. 2 is a graphic diagram showing relations between threshold voltages (Vt) and pass voltages (Vpass) when program disturbance due to hot electrons occurs in the memory cells MC0 and MC31 shown in FIG. 1. It can be seen from FIG. 2, that the memory cells MC0 and MC31 coupled to the wordlines WL1 and WL31 are featured with characteristics quite different from the memory cells MC1 through MC30 coupled to the other wordlines WL1 through WL30. This is because of the program disturbance explained above.

Such program disturbance slows down a programming speed, degrading the performance of the device.

BRIEF SUMMARY OF THE INVENTION

The present invention is directed to a NAND flash memory device preventing program disturbance at a memory cell adjacent to a source selection transistor.

The present invention is also directed to a NAND flash memory device preventing program disturbance at a memory cell adjacent to a drain selection transistor.

The present invention is further directed to a NAND flash memory device preventing program disturbance at memory cells adjacent to source and drain selection transistors.

The present invention also provide a NAND flash memory device preventing program disturbance at a memory cell adjacent to a source selection transistor without increasing a chip size thereof.

One aspect of the present invention is to provide a NAND flash memory device comprising: a drain selection transistor coupled to a bitline; a source selection transistor coupled to a source line; and pluralities of memory cells coupled in series between the drain selection transistor and the source selection transistors, wherein an interval between the source selection transistor and the memory cell adjacent to the source selection transistor is wider than intervals between the other memory cells.

In one embodiment, the interval between the source selection transistor and the memory cell adjacent to the source selection transistor is wider than the intervals between the other memory cells by about 3% to 15%.

Another aspect of the invention is a NAND flash memory device comprising: a drain selection transistor coupled to a bitline; a source selection transistor coupled to a source line; and pluralities of memory cells coupled in series between the drain selection transistor and the source selection transistors, wherein an interval between the drain selection transistor and the memory cell adjacent to the drain selection transistor is wider than intervals between the other memory cells.

In one embodiment, the interval between the drain selection transistor and the memory cell adjacent to the source selection transistor is wider than the intervals between the other memory cells by about 3% to 15%.

Still another aspect of the present invention is a NAND flash memory device comprising: a drain selection transistor coupled to a bitline; a source selection transistor coupled to a source line; and pluralities of memory cells coupled in series between the drain selection transistor and the source selection transistors, wherein intervals between the source selection transistor and the memory cell adjacent to the source selection transistor and between the drain selection transistor and the memory cell adjacent to the drain selection transistor are wider than intervals between the other memory cells.

In one embodiment, the intervals between the source selection transistor and the memory cell adjacent to the source selection transistor and between the drain selection transistor and the memory cell adjacent to the drain selection transistor are wider than the intervals between the other memory cells by about 3% to 15%.

Another aspect of the present invention is a NAND flash memory device comprising: a drain selection transistor coupled to a bitline; a source selection transistor coupled to a source line; and pluralities of memory cells coupled in series between the drain selection transistor and the source selection transistors, wherein an interval between the source selection transistor and the memory cell adjacent to the source selection transistor is wider than intervals between the other memory cells while an interval between the drain selection transistor and the memory cell adjacent to the drain selection transistor is narrower than the intervals between the other memory cells.

In one embodiment, the interval between the source selection transistor and the memory cell adjacent to the source selection transistor is wider than the intervals between the other memory cells by about 3% to 15% while an interval between the drain selection transistor and the memory cell adjacent to the drain selection transistor is narrower than the intervals between the other memory cells by about 3% to 15%.

Another aspect of the present invention is a NAND flash memory device comprising: a drain selection transistor coupled to a bitline; a source selection transistor coupled to a source line; and pluralities of memory cells coupled in series between the drain selection transistor and the source selection transistors, wherein a trench is formed in a semiconductor substrate between the source selection transistor and the memory cell adjacent to the source selection transistor so as to enlarge an effective channel length within a restricted area more than effective channel lengths of the other memory cells.

Another aspect of the present invention is a NAND flash memory device comprising: a drain selection transistor coupled to a bitline; a source selection transistor coupled to a source line; and pluralities of memory cells coupled in series between the drain selection transistor and the source selection transistors, wherein a trench is formed in a semiconductor substrate between the drain selection transistor and the memory cell adjacent to the drain selection transistor so as to enlarge an effective channel length within a restricted area more than effective channel lengths of the other memory cells.

Still another aspect of the present invention is a NAND flash memory device comprising: a drain selection transistor coupled to a bitline; a source selection transistor coupled to a source line; and pluralities of memory cells coupled in series between the drain selection transistor and the source selection transistors, wherein a first trench is formed in a semiconductor substrate between the source selection transistor and the memory cell adjacent to the source selection transistor while a second trench is formed in a semiconductor substrate between the drain selection transistor and the memory cell adjacent to the drain selection transistor, so as to enlarge effective channel lengths within a restricted area more than effective channel lengths of the other memory cells.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF THE INVENTION

Embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Hereinafter, it will be described about an exemplary embodiment of the present invention in conjunction with the accompanying drawings.

Figure 1:
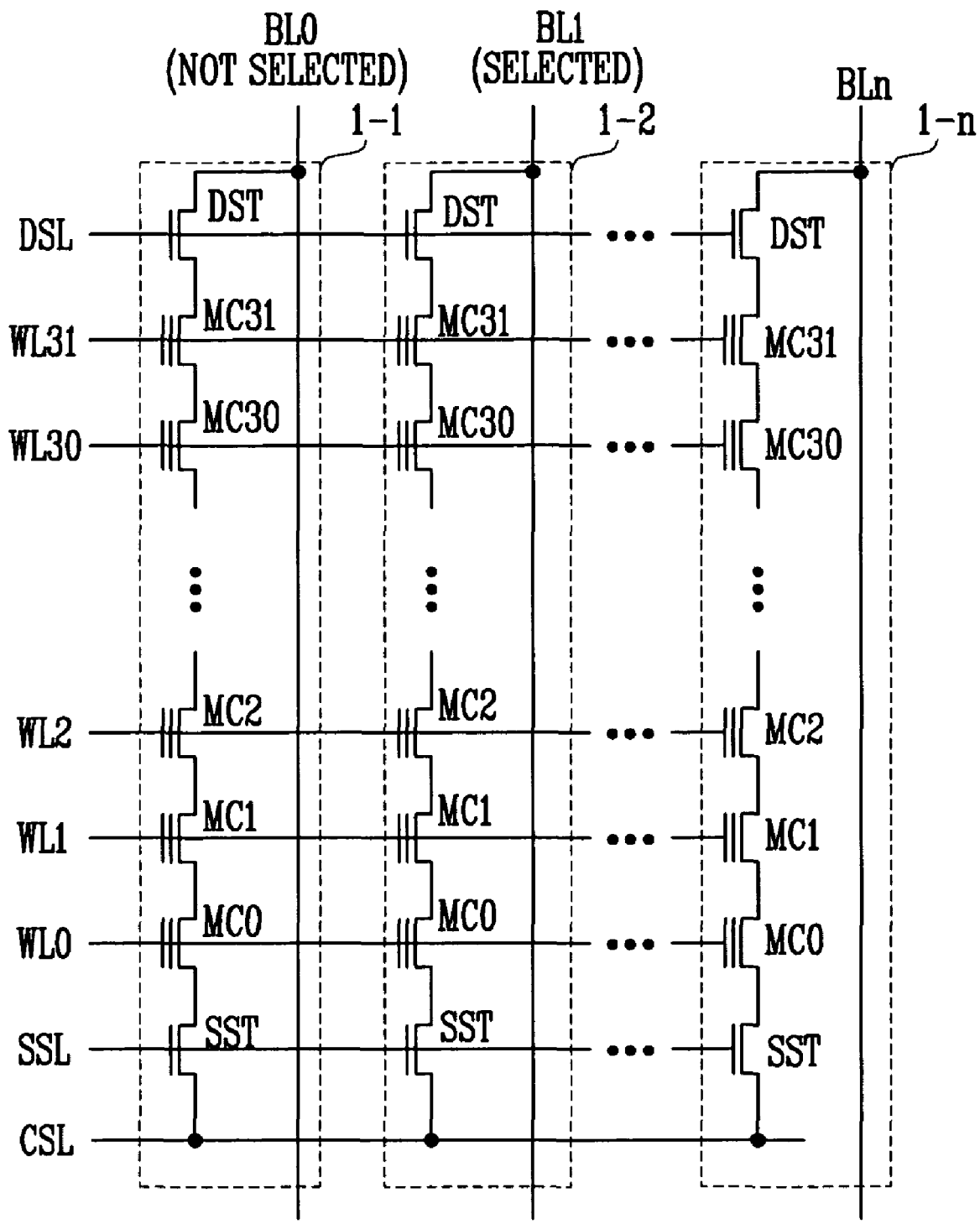
FIG. 1 is a circuit diagram showing a conventional NAND flash memory device.
Figure 2:
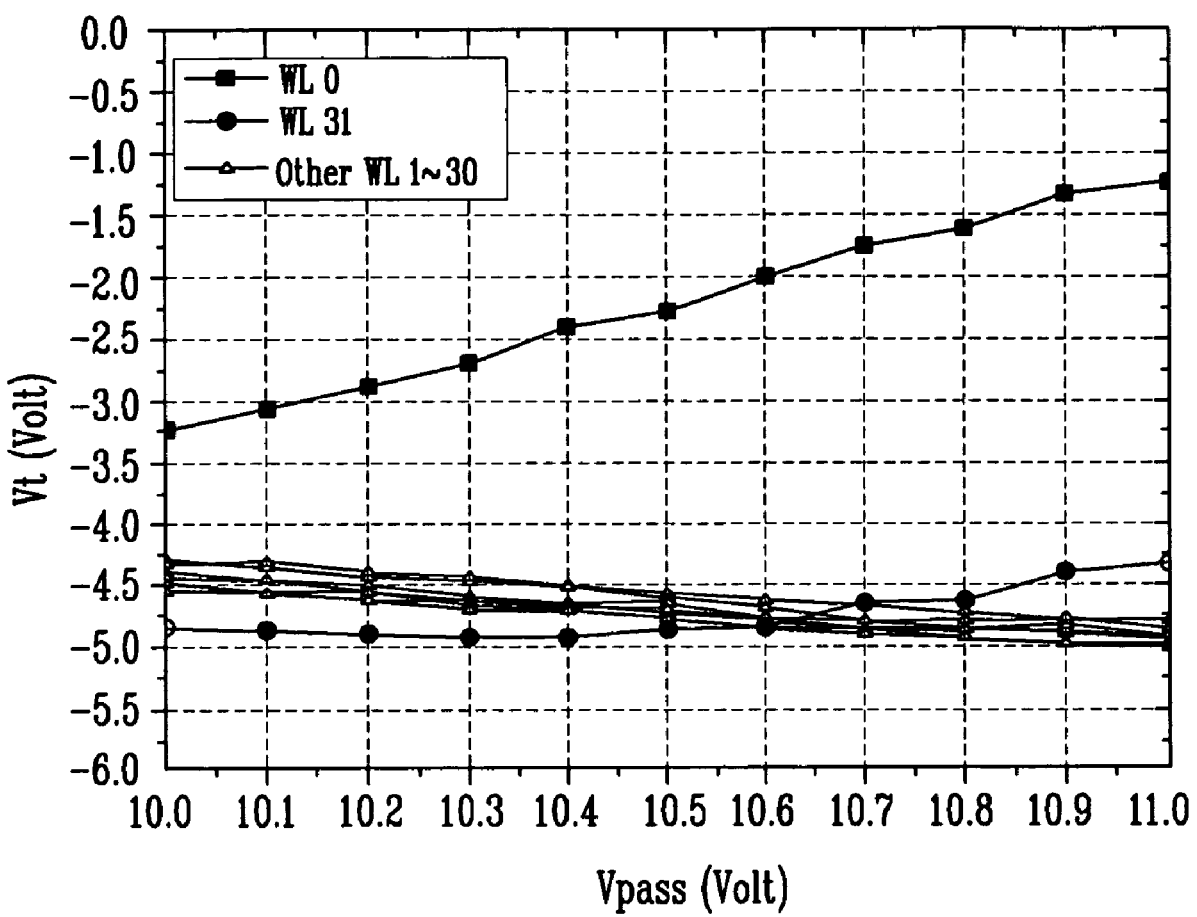
FIG. 2 is a graphic diagram showing relations between threshold voltages (Vt) and pass voltages (Vpass) when there is program disturbance due to hot electrons in the memory cells shown in FIG. 1.
Figure 3:
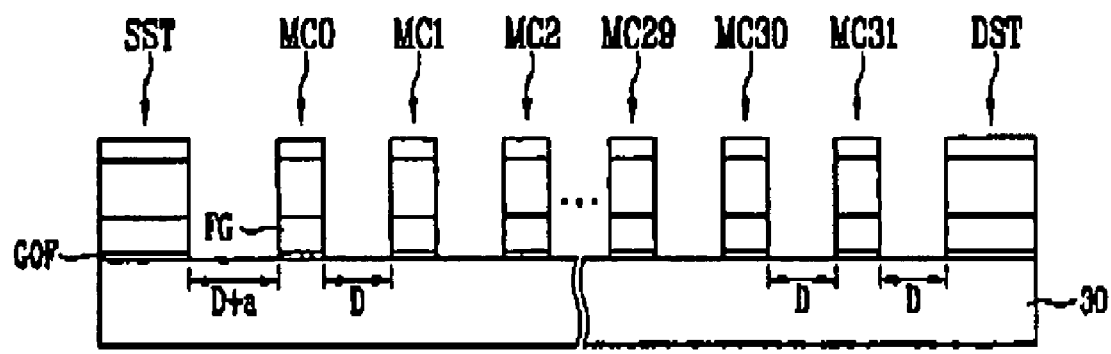
FIG. 3 is a sectional diagram illustrating a string structure of a NAND flash memory device in accordance with one embodiment of the present invention.

FIG. 3 is a sectional diagram illustrating a cell string structure of a NAND flash memory device in accordance with one embodiment of the present invention. The cell string includes a source selection transistor SST, a drain selection transistor DST, and memory cells MC0 and MC31 coupled between the source selection transistor SST and the drain selection transistor in series.

The memory cells MC0 through MC31 are arranged with a first interval D apart from each other. Memory cell MC31 is adjacent to the drain selection transistor DST in the first interval D. The memory cell MC0 is adjacent to the source selection transistor SST in a second interval D+a that is wider than the first interval D by a predetermined range. In one embodiment, the second interval D+a is wider than the first interval D by about 3% to 15% laterally.

Because the interval between the source selection transistor SST and the memory cell MC0 adjacent thereto is wider than other intervals between the drain selection transistor and the memory cell MC31, and between the memory cells MC0 through MC31, the effect of hot electrons causing program disturbance is reduced. With reducing the effect of program disturbance at the memory cell MC0, the operation speed in programming the memory cell MC0 increases. This mechanism will be understood through the following description in detail.

A strong electric field is generated between the source selection transistor SST and the memory cell MC0 by a voltage difference between a source voltage 0V of the source selection transistor SST and a channel voltage 8V under the memory cell MC0. When there is the strong electric field laterally between the source selection transistor SST and the memory cell adjacent thereto, electrons, which are generated from the interfaces among the semiconductor substrate 30 and a gate oxide film (GOF) of the source selection transistor SST, move toward the memory cell MC0 along the surface of the semiconductor substrate 30 and are referred as hot electrons. These hot electrons move vertically and flow into a floating gate is of the memory cell MC0 not to be programmed, causing the memory cell MC0 to be programmed undesirably.

Therefore, if the interval between the source selection transistor SST and the memory cell MC0 becomes wider, it is more difficult for electrons to flow into the floating gate (FG) of the memory cell MC0 because the energy of the electrons is weakened while they are moving toward the memory cell MC0.

In other words, a leakage current is generated by electron-hole pairs (EHP) at the interface between the semiconductor substrate 30 and the gate oxide film (GOF) of the source selection transistor SST. The holes generated flow into the semiconductor substrate 30 and the electrons move toward the memory cell MC0 along the surface of the semiconductor substrate 30. Here, due to the wider interval between the source selection transistor SST and the memory cell MC0, the electrons move a longer distance to the memory cell MC0. As a result, the effect of program disturbance at the memory cell MC0 is reduced, increasing a programming operation speed.

Figure 10:
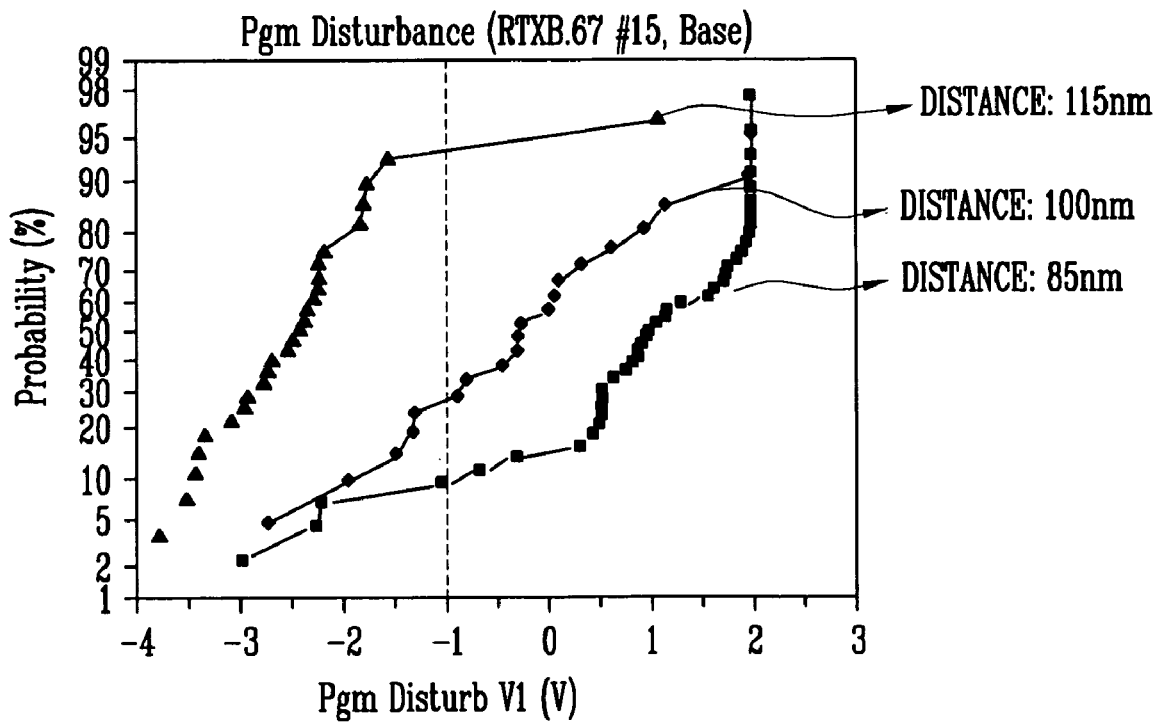
FIG. 10 is a graphic diagram comparing effects of program disturbance according to variation of an interval between a source selection transistor and a memory cell adjacent to the source selection transistor.

FIG. 10 is a graphic diagram comparing effects of program disturbance according to variation of an interval between the source selection transistor SST and the memory cell MC0 adjacent to the source selection transistor. It can be seen from the graph of FIG. 10 that the program disturbance becomes weaker as the interval between the memory cell MC0 and the source selection transistor SST is increased from 85 nm to 115 nm.

Figure 4:
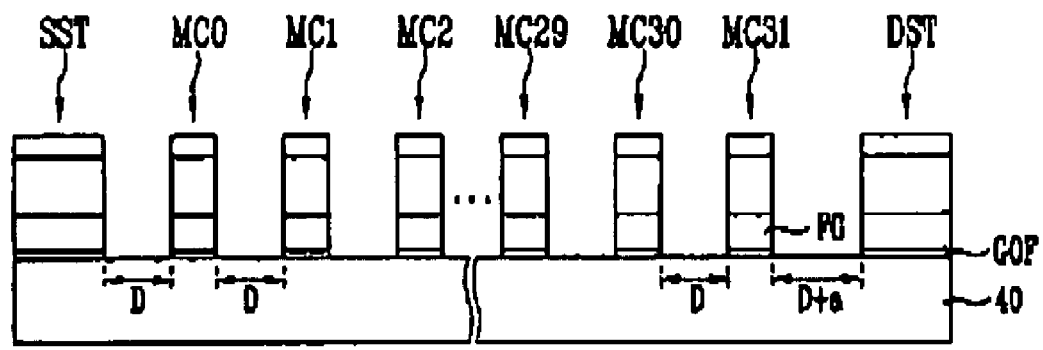
FIG. 4 is a sectional diagram illustrating a string structure of a NAND flash memory device in accordance with another embodiment of the present invention.

FIG. 4 is a sectional diagram illustrating a string structure of a NAND flash memory device in accordance with another embodiment of the present invention. The cell string includes a source selection transistor SST, a drain selection transistor DST, and memory cells MC0 and MC31 coupled between the source selection transistor SST and the drain selection transistor in series.

The memory cells MC0 through MC31 are arranged to be a first interval D apart from each other. Memory cell MC0 is adjacent to the source selection transistor SST in the first interval D. The memory cell MC31 is adjacent to the drain selection transistor DST in a second interval D+a that is wider than the first interval D by a predetermined range. In one embodiment, the second interval D+a is wider than the first interval D by about 3% to 15% laterally.

Because the second interval between the drain selection transistor DST and the memory cell MC31 adjacent thereto is wider than the first interval, the effect of hot electrons causing the program disturbance of the memory cell MC31 is reduced. With reducing the effect of program disturbance at the memory cell MC31, the operation speed in programming the memory cell MC31 increases. This mechanism will be understood through the following description in detail.

A strong electric field is generated between the drain selection transistor DST and the memory cell MC31 by a voltage difference between the power source voltage Vcc of the drain selection transistor DST and a channel voltage 8V under the memory cell MC31. When there is the strong electric field laterally between the drain selection transistor DST and the memory cell adjacent thereto, electrons, which are generated from the interfaces among the semiconductor substrate 40 and a gate oxide film (GOF) of the drain selection transistor DST, move toward the memory cell MC31 along the surface of the semiconductor substrate and are referred as hot electrons. These hot electrons move vertically and flow into a floating gate (FG) of the memory cell MC31 not to be programmed, causing the memory cell MC31 to be programmed undesirably.

Therefore, if the interval between the drain selection transistor DST and the memory cell MC31 becomes wider, it is more difficult for electrons to flow into the floating gate (FG) of the memory cell MC31 because the energy of the electrons is weakened while they are moving toward the memory cell MC31.

In other words, a leakage current is generated by electron-hole pairs (EHP) at the interface between the semiconductor substrate 40 and the gate oxide film (GOF) of the drain selection transistor DST. The holes generated flow into the semiconductor substrate 40 and the electrons move toward the memory cell MC31 along the surface of the semiconductor substrate 40. Here, due to the wider interval between the drain selection transistor DST and the memory cell MC31, the electrons move a longer distance to the memory cell MC31. As a result, the effect of program disturbance at the memory cell MC31 is reduced, increasing a programming operation speed.

Figure 5:
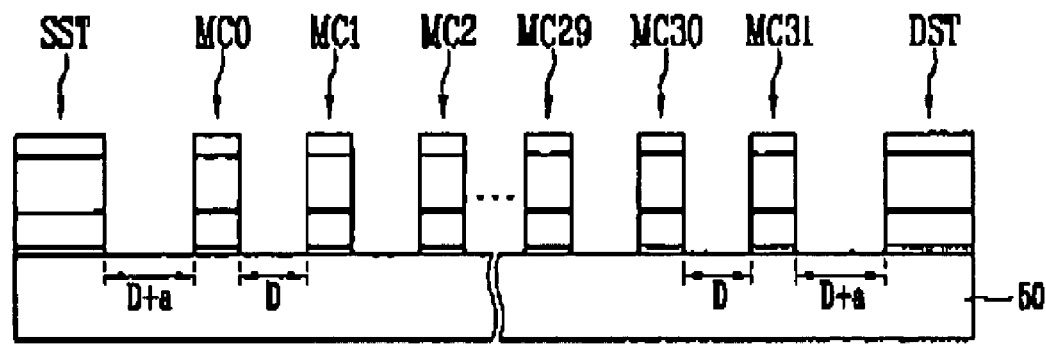
FIG. 5 is a sectional diagram illustrating a string structure of a NAND flash memory device in accordance with still another embodiment of the present invention.

FIG. 5 is a sectional diagram illustrating a string structure of a NAND flash memory device in accordance with another embodiment of the present invention. The cell string includes a source selection transistor SST, a drain selection transistor DST, and memory cells MC0 and MC31 coupled between the source selection transistor SST and the drain selection transistor in series. The reference numeral 50 denotes a semiconductor substrate.

The memory cells MC0 through MC31 are arranged with a first interval D apart from each other. The memory cell MC0 is adjacent to the source selection transistor SST in a second interval D+a that is wider than the first interval D by a predetermined range and the memory cell MC31 is adjacent to the drain selection transistor DST in the second interval D+a. In one embodiment, the second interval D+a is wider than the first interval D by about 3% to 15% laterally.

As the intervals between the source selection transistor SST and the memory cell MC0 adjacent thereto and between the drain selection transistor DST and the memory cell MC31 adjacent thereto are enlarged with the second interval D+a, the effect of hot electrons causing program disturbance of the memory cells MC0 and MC31 is reduced. With reducing the effect of program disturbance at the memory cells MC0 and MC31, the operation speeds in programming the memory cells MC0 and MC31 increase. This mechanism of lessening the program disturbance will be understood through the former descriptions described above.

Figure 6:
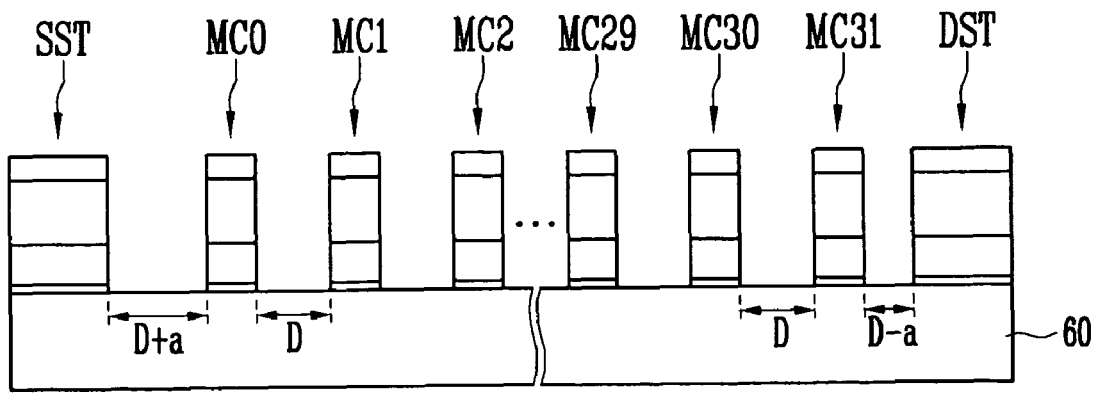
FIG. 6 is a sectional diagram illustrating a string structure of a NAND flash memory device in accordance with another embodiment of the present invention.

FIG. 6 is a sectional diagram illustrating a string structure of a NAND flash memory device in accordance with another embodiment of the present invention. The cell string includes a source selection transistor SST, a drain selection transistor DST, and memory cells MC0 and MC31 coupled between the source selection transistor SST and the drain selection transistor in series. The reference numeral 60 denotes a semiconductor substrate.

The memory cells MC0 through MC31 are arranged with a first interval D apart from each other. The memory cell MC0 is adjacent to the source selection transistor SST in a second interval D+a that is wider than the first interval D by a predetermined range. Memory cell MC31 is adjacent to the drain selection transistor DST in a third interval D−a that is less than the first interval D by a predetermined range. In one embodiment, the second interval D+a is wider than the first interval D by about 3% to 15% laterally while the third interval D−a is narrower than the first interval D by about 3% to 15% laterally. In one embodiment, in order to maintain a desired chip size of the flash memory device without increasing the chip size thereof, the design ranges of the second and third intervals D+a and D−a use the same value for 'a'.

As the interval between the source selection transistor SST and the memory cell MC0 adjacent thereto are enlarged, the effect of hot electrons causing program disturbance of the memory cells MC0 is reduced. With reducing the effect of program disturbance at the memory cells MC0, the operation speed in programming the memory cell MC0 increases.

Figure 7:
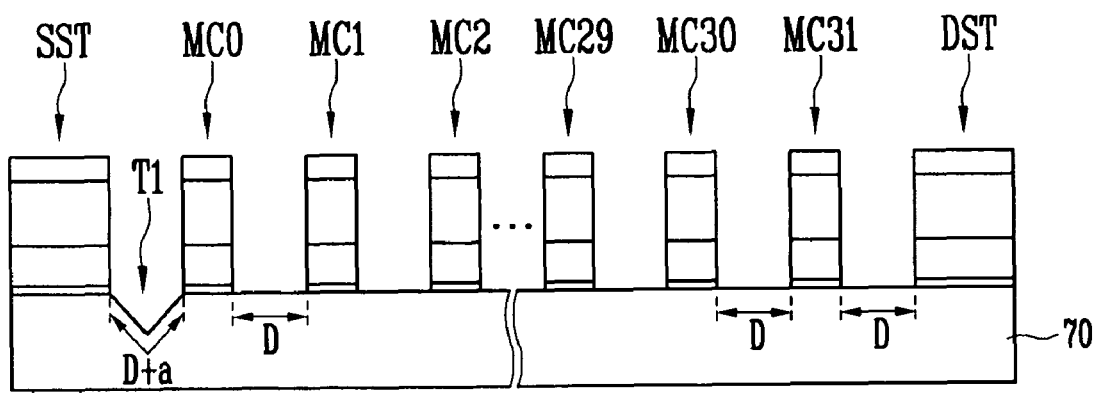
FIG. 7 is a sectional diagram illustrating a string structure of a NAND flash memory device in accordance with still another embodiment of the present invention.

FIG. 7 is a sectional diagram illustrating a string structure of a NAND flash memory device in accordance with another embodiment of the present invention. The cell string includes a source selection transistor SST, a drain selection transistor DST, and memory cells MC0 and MC31 coupled between the source selection transistor SST and the drain selection transistor in series.

The memory cells MC0.about.MC31 are arranged with a first interval D apart from each other. The memory cell MC31 is adjacent to the drain selection transistor DST with the first interval D. The memory cell MC0 is adjacent to the source selection transistor SST with interposing a first trench T1 therebetween in the semiconductor substrate 70. The first trench T1 creates an effective channel length between the source selection transistor SST and the memory cell MC0 that is larger than the first interval under a restricted area. Thus, the effective channel length between the source selection transistor SST and the memory cell MC0 becomes enlarged up to a second interval D+a that is lengthened by the dimension of the first trench T1. The pattern of the first trench T1 is depicted in the form of "V" in FIG. 7, but other patterns may exist in accordance with the present invention.

As the effective channel length between the source selection transistor SST and the memory cell MC0 is enlarged within the restricted area by forming the first trench T1 between the source selection transistor SST and the memory cell MC0 adjacent thereto, the effect of hot electrons causing the program disturbance of the memory cell MC0 is reduced. With reducing the effect of program disturbance at the memory cell MC0, the operation speed in programming the memory cell MC0 increases. This mechanism of lessening the program disturbance will be understood through the following description in detail.

If first trench T1 enlarges the effective channel length between the source selection transistor SST and the memory cell MC0 within the restricted area, motion ranges of electrons increase to cause the recombination rates and mobility of the electrons to be reduced. Thus, the number of the electrons reaching the memory cell MC0 decreases. As the electrons injecting into the floating gate of the memory cell MC0 is reduced in number, the hot electron injection is restrained to lower the effect of program disturbance.

Figure 8:
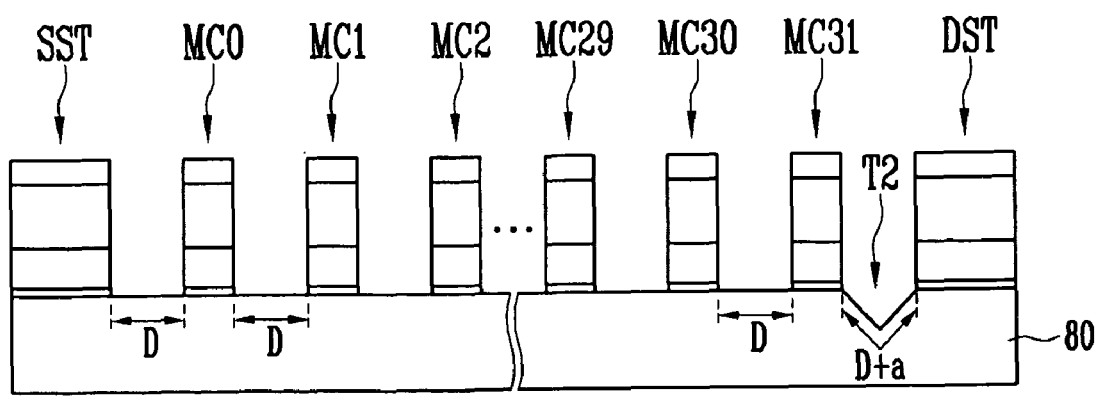
FIG. 8 is a sectional diagram illustrating a string structure of a NAND flash memory device in accordance with another embodiment of the present invention.

FIG. 8 is a sectional diagram illustrating a string structure of a NAND flash memory device in accordance with another embodiment of the present invention. The cell string includes a source selection transistor SST, a drain selection transistor DST, and memory cells MC0 and MC31 coupled between the source selection transistor SST and the drain selection transistor in series.

The memory cells MC0.about.MC31 are arranged with a first interval D apart from each other. Memory cell MC0 is adjacent to the source selection transistor SST with the first interval D. Memory cell MC31 is adjacent to the drain selection transistor DST with interposing a second trench T2 therebetween in the semiconductor substrate 80. The second trench T2 creates an effective channel length between the drain selection transistor DST and the memory cell MC31 that is larger than the first interval under a restricted area. Thus, the effective channel length between the drain selection transistor DST and the memory cell MC31 becomes enlarged up to a second interval D+a that is lengthened by the dimension of the second trench T2. The pattern of the second trench T2 is depicted in the form of "V" in FIG. 8, but other patterns are available in accordance with the present invention.

As the effective channel length between the drain selection transistor DST and the memory cell MC31 is enlarged within the restricted area by forming the second trench T2 between the drain selection transistor DST and the memory cell MC31 adjacent thereto, the effect of hot electrons causing program disturbance of the memory cell MC31 is reduced. With reducing the effect of program disturbance at the memory cell MC31, the operation speed in programming the memory cell MC31 increases.

Figure 9:
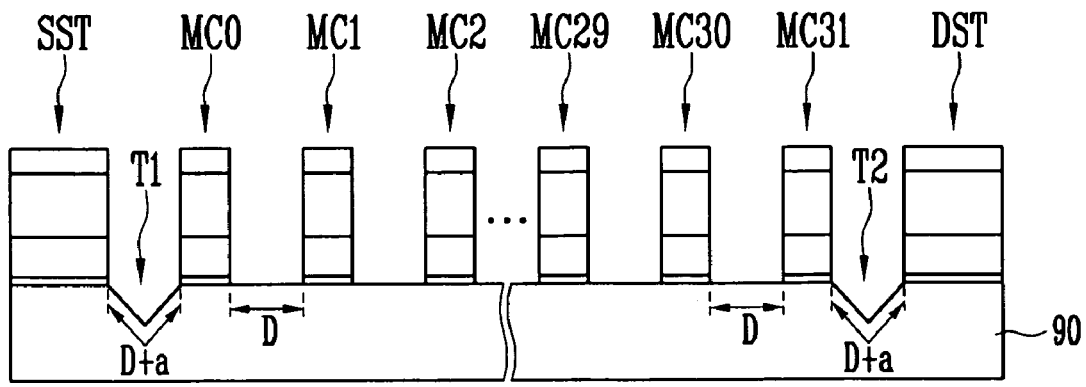
FIG. 9 is a sectional diagram illustrating a string structure of a NAND flash memory device in accordance with still another embodiment of the present invention.

FIG. 9 is a sectional diagram illustrating a string structure of a NAND flash memory device in accordance with another embodiment of the present invention. The cell string includes a source selection transistor SST, a drain selection transistor DST, and memory cells MC0 and MC31 coupled between the source selection transistor SST and the drain selection transistor in series.

The memory cells MC0.about.MC31 are arranged with a first interval D apart from each other. The memory cell MC0 is adjacent to the source selection transistor SST with interposing a first trench T1 therebetween in the semiconductor substrate 90. The first trench T1 creates an effective channel length between the source selection transistor SST and the memory cell MC0 that is larger than the first interval under a restricted area. Thus, the effective channel length between the source selection transistor SST and the memory cell MC0 becomes enlarged up to a second interval D+a that is lengthened by the dimension of the first trench T1. Meanwhile, the memory cell MC31 is adjacent to the drain selection transistor DST with interposing a second trench T2 therebetween in the semiconductor substrate 90. The second trench T2 also creates an effective channel length between the drain selection transistor DST and the memory cell MC31 that is larger than the first interval under a restricted area. Thus, the effective channel length between the drain selection transistor DST and the memory cell MC31 becomes enlarged up to the second interval D+a that is lengthened by the dimension of the second trench T2. The patterns of the first and second trenches T1 and T2 are depicted in the form of "V" in FIG. 9, but it should be appreciated that other patterns exist in accordance with the present invention.

As the effective channel lengths between the source selection transistor SST and the memory cell MC0 and between the drain selection transistor DST and the memory cell MC31 are enlarged within the restricted area by forming the first and second trenches T1 and T2 between the source selection transistor SST and the memory cell MC0 and between the drain selection transistor DST and the memory cell MC31 adjacent thereto, the effect of hot electrons causing the program disturbance of the memory cells MC0 and MC31 is reduced. With reducing the effect of program disturbance at the memory cells MC0 and MC31, the operation speeds in programming the memory cells MC0 and MC31 increase.

While 32 memory cells MC0~MC31 are configured as being coupled in series between the source selection transistor SST and the drain selection transistor DST in FIGS. 3 through 9, it should be appreciated that in other embodiments, 16 or 64 memory cells are coupled in series. And, although there are shown with a single cell string in FIGS. 3 through 9, it should be understood that the NAND flash memory device includes pluralities of cell strings. That is, the NAND flash memory device is constructed such that the source selection transistor SST is coupled to the source selection line, the drain selection transistor DST is coupled to the drain selection line, and the memory cells MC0~MC31 are each coupled to the wordlines WL0~WL31.

As aforementioned, enlarging the intervals between the selection transistors and the memory cells adjacent thereto, the effect of hot electrons causing program disturbance of the memory cells is reduced. With reducing the effect of program disturbance at the memory cells, the operation speeds in programming the memory cells increase.

In addition, with increasing an interval between the source selection transistor and the memory cell adjacent thereto but decreasing an interval between the drain selection transistor and the memory cell adjacent thereto, the chip size can be preserved while reducing the effect of program disturbance.

While embodiments of the present invention have been illustrated and described, it will be understood by those ordinary skilled in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A NAND flash memory device comprising:
a drain selection transistor of a cell string provided on a semiconductor substrate;
a source selection transistor of the cell string provided on the semiconductor substrate;
a first memory cell of the cell string disposed adjacent to the drain selection transistor;
a second memory cell of the cell string disposed adjacent to the source selection transistor; and
third memory cells of the cell string located between the first and the second memory cells,
wherein a first distance from the source selection transistor to the second memory cell is determined by adding a predetermined value to a second distance from a first of the third memory cells to a second of the third memory cells, wherein the first and second of the third memory cells are adjacently disposed and the predetermined value is a non-zero positive value, and
a third distance from the drain selection transistor to the first memory cell is determined by subtracting the predetermined value from the second distance to prevent a chip size from increasing due to the first distance being greater than the second distance.

2. A NAND flash memory device comprising:
a drain selection transistor of a cell string provided on a semiconductor substrate;
a source selection transistor of the cell string provided on the semiconductor substrate;
a first memory cell of the cell string disposed adjacent to the drain selection transistor;
a second memory cell of the cell string disposed adjacent to the source selection transistor;
third memory cells of the cell string located between the first and the second memory cells; and
a trench formed in the semiconductor substrate at an area between a word line of the first memory cell and a drain selection line of the drain selection transistor,
wherein the trench has a first surface distance that is greater than a second surface distance of the semiconductor substrate between each pair of adjacent third memory cells.

3. A NAND flash memory device comprising:
a drain selection transistor of a cell string provided on a semiconductor substrate:
a source selection transistor of the cell string provided on the semiconductor substrate;
a first memory cell of the cell string disposed adjacent to the drain selection transistor;
a second memory cell of the cell string disposed adjacent to the source selection transistor;
third memory cells of the cell string located between the first and the second memory cells; and
a trench formed in the semiconductor substrate at an area between a word line of the second memory cell and a source selection line of the source selection transistor,
wherein the trench has a first surface distance that is greater than a second surface distance of the semiconductor substrate between each pair of adjacent third memory cells.

4. A NAND flash memory device comprising:
a drain selection transistor of a cell string provided on a semiconductor substrate;
a source selection transistor of the cell string provided on the semiconductor substrate;
a first memory cell of the cell string disposed adjacent to the drain selection transistor;
a second memory cell of the cell string disposed adjacent to the source selection transistor;
third memory cells of the cell string located between the first and the second memory cells;
a first trench formed in the semiconductor substrate at an area between a first word line of the first memory cell and a drain selection line of the drain selection transistor, wherein the first trench has a first surface distance that is greater than a second surface distance of the semiconductor substrate between each pair of adjacent third memory cells; and
a second trench formed in the semiconductor substrate at an area between a second word line of the second memory cell and a source selection line of the source selection transistor, wherein the second trench has a third surface distance that is greater than the second surface distance of the semiconductor substrate between each pair of adjacent third memory cells.

* * * * *